United States Patent
Hickey et al.

(10) Patent No.: US 7,260,765 B2
(45) Date of Patent: Aug. 21, 2007

(54) METHODS AND APPARATUS FOR DYNAMICALLY RECONFIGURABLE PARALLEL DATA ERROR CHECKING

(75) Inventors: Mark J. Hickey, Rochester, MN (US); Robert A. Shearer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 11/016,217

(22) Filed: Dec. 17, 2004

(65) Prior Publication Data
US 2006/0136801 A1     Jun. 22, 2006

(51) Int. Cl.
*H03M 13/00* (2006.01)
(52) U.S. Cl. .................. 714/779; 714/774
(58) Field of Classification Search ............. 714/779, 714/774
See application file for complete search history.

(56) References Cited

U.S. PATENT DOCUMENTS

| | | | |
|---|---|---|---|
| 4,573,045 A | 2/1986 | Galin ................. 340/825.5 |
| 6,449,699 B2 | 9/2002 | Franke et al. | |
| 6,530,057 B1* | 3/2003 | Kimmitt .............. 714/758 |
| 6,701,478 B1* | 3/2004 | Yang et al. ........... 714/757 |
| 6,820,143 B2 | 11/2004 | Day et al. | |
| 6,820,174 B2 | 11/2004 | Vanderwiel | |
| 7,191,383 B2* | 3/2007 | Lin et al. ............ 714/774 |
| 2004/0117592 A1 | 6/2004 | Day et al. | |
| 2004/0162946 A1 | 8/2004 | Day et al. | |
| 2004/0263519 A1 | 12/2004 | Andrews et al. | |

* cited by examiner

*Primary Examiner*—Joseph D. Torres
(74) *Attorney, Agent, or Firm*—Dugan & Dugan

(57) ABSTRACT

In a first aspect, a first method is provided. The first method includes the steps of (1) transmitting data on a bus, wherein data is presented on the bus using varying widths; (2) configuring a cyclic redundancy check (CRC) to be performed on the data based on the manner in which the data is presented on the bus; and (3) performing the CRC on the data. Numerous other aspects are provided.

20 Claims, 3 Drawing Sheets

| 1st 8 Bytes | crc_in | data (48:63) | 2nd 8 Bytes | crc_in | data (48:63) |
|---|---|---|---|---|---|
| 8 Byte Packet | FF | zeros | 8 Byte Packet | FF | zeros |
| 8 Byte Packet | FF | zeros | > 8 Byte Packet – start | FF | data |
| > 8 Byte Packet – end | Intermed crc | zeros | 8 Byte Packet | FF | zeros |
| > 8 Byte Packet – end | Intermed crc | data | > 8 Byte Packet – start | FF | data |
| > 8 Byte Packet – start | FF | data | - - - - - → | Intermed crc | data |
| > 8 Byte Packet – cont | Intermed crc | data | - - - - - → | Intermed crc | data |
| > 8 Byte Packet – end | Intermed crc | data | - - - - - → | Intermed crc | zeros |

FIG. 2

METHODS AND APPARATUS FOR DYNAMICALLY RECONFIGURABLE PARALLEL DATA ERROR CHECKING

FIELD OF THE INVENTION

The present invention relates generally to processors, and more particularly to methods and apparatus for dynamically reconfigurable parallel data error checking.

BACKGROUND

Conventional logic performs continuous error checking, such as cyclic redundancy checking (CRC), on data presented in a fixed-width. However, such logic may not perform CRC on data presented in variable widths. Accordingly, methods and apparatus are desired for performing CRC on data presented in variable widths.

SUMMARY OF THE INVENTION

In a first aspect of the invention, a first method is provided. The first method includes the steps of (1) transmitting data on a bus, wherein data is presented on the bus using varying widths; (2) configuring a cyclic redundancy check (CRC) to be performed on the data based on the manner in which the data is presented on the bus; and (3) performing the CRC on the data.

In a second aspect of the invention, a method is provided for checking data for errors. The method includes the steps of (1) transmitting one or more portions of one or more packets on a bus, wherein a length of each of the one or more packets are a multiple of a predetermined size and the bus width is a multiple greater than 1 of the predetermined size; (2) determining whether the bus is transmitting one or more portions of a plurality of packets; (3) if the bus is transmitting one or more portions of a plurality of packets, performing a cyclic redundancy check (CRC) on the one or more portions of each of the plurality of packets in parallel; and (4) if the bus is not transmitting one or more portions of a plurality of packets, (a) performing a CRC on the one or more portions of the packet transmitted on a first portion of the bus; and (b) performing a CRC on the one or more portions of the packet transmitted on a second portion of the bus based on a result of the CRC performed on the one or more portions of the packet transmitted on the first portion of the bus.

In a third aspect of the invention, a first apparatus is provided. The first apparatus includes (1) a bus for transmitting data; (2) CRC logic, coupled to the bus, for performing CRC on data received from the bus; and (3) control logic, coupled to the bus and CRC logic, for providing control signals to the CRC logic. The first apparatus is adapted to (a) transmit data on the bus, wherein data is presented on the bus using varying widths; (b) configure a cyclic redundancy check (CRC) to be performed on the data based on the manner in which data is presented on the bus; and (c) perform the CRC on the data.

In a fourth aspect of the invention, an apparatus is provided for checking data for errors. The apparatus includes (1) a bus for transmitting data packets, wherein the bus width is a multiple greater than 1 of a predetermined size; (2) CRC logic, coupled to the bus, for performing CRC on data packets received from the bus; and (3) control logic, coupled to the bus and CRC logic, for providing control signals to the CRC logic. The apparatus is adapted to (a) transmit one or more portions of one or more packets on the bus, wherein a length of each of the one or more packets are a multiple of the predetermined size; (b) determine whether the bus is transmitting one or more portions of a plurality of packets; (c) if the bus is transmitting one or more portions of a plurality of packets, perform a cyclic redundancy check (CRC) on the one or more portions of each of the plurality of packets in parallel; and (d) if the bus is not transmitting one or more portions of a plurality of packets, (i) perform a CRC on the one or more portions of the packet transmitted on a first portion of the bus; and (ii) perform a CRC on the one or more portions of the packet transmitted on a second portion of the bus based on a result of the CRC performed on the one or more portions of the packet transmitted on the first portion of the bus. Numerous other aspects are provided in accordance with these and other aspects of the invention.

Other features and aspects of the present invention will become more fully apparent from the following detailed description, the appended claims and the accompanying drawings.

BRIEF DESCRIPTION OF THE FIGURES

FIG. 2 illustrates different ways in which one or more data packets are transmitted on a bus of the apparatus and corresponding values upon which control signals output by control logic of the apparatus are based in accordance with an embodiment of the present invention.

DETAILED DESCRIPTION

The present invention provides methods and apparatus for performing continuous error checking, such as cyclic redundancy checking (CRC), on data. More specifically, according to the present methods and apparatus, logic may perform CRC on data presented in varying widths. For example, logic may receive one or more portions of one or more data packets from a bus of a predetermined width and perform CRC on the one or more data packets.

Figure 1:
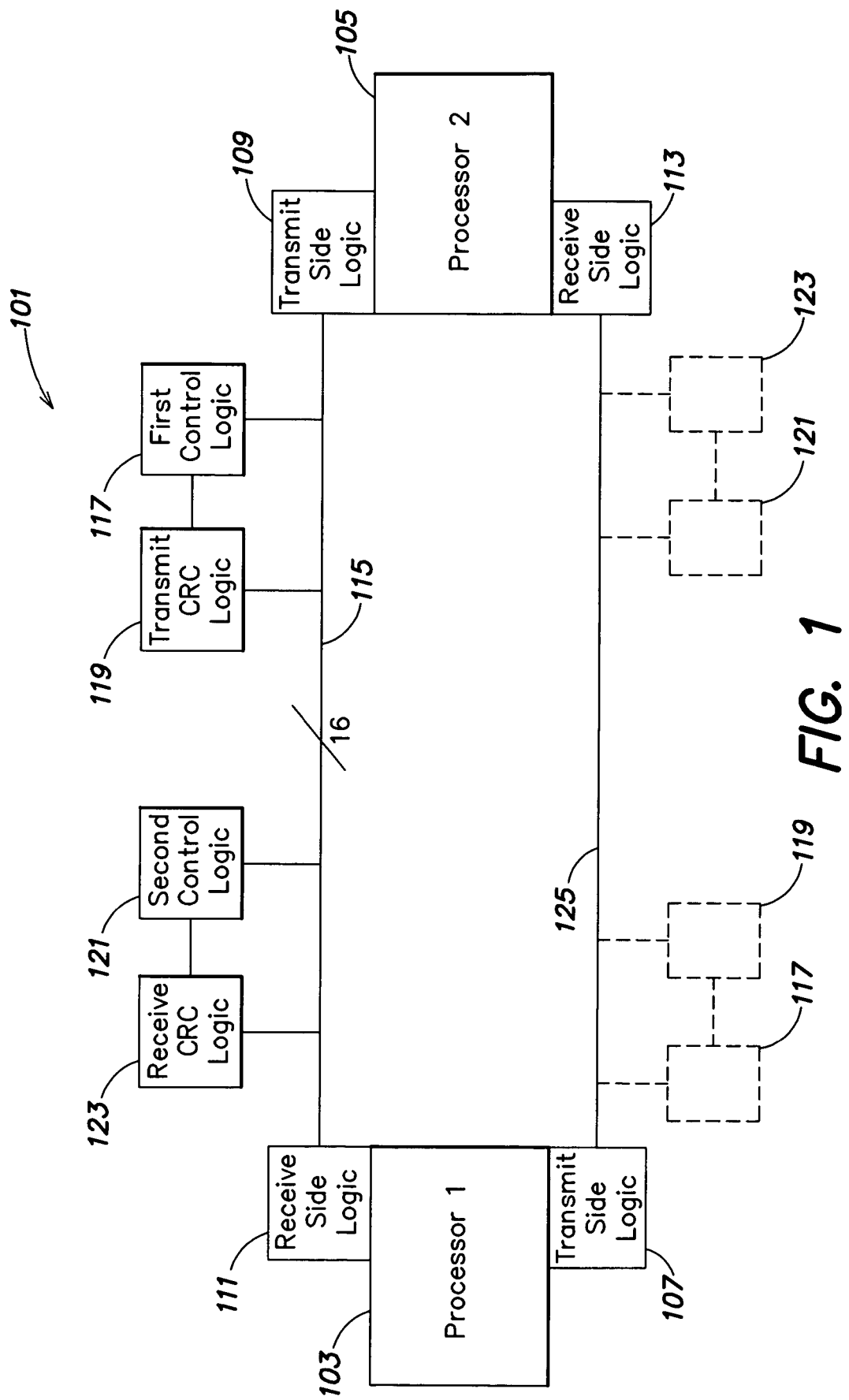
FIG. 1 is a block diagram of an apparatus for checking data for errors in accordance with an embodiment of the present invention.

FIG. 1 is a block diagram of an apparatus for checking data for errors in accordance with an embodiment of the present invention. With reference to FIG. 1, the apparatus 101 for checking data for errors includes a first processor (e.g., central processing unit (CPU)) 103 coupled to a second processor (e.g., graphics processing unit (GPU)) 105. Each processor 103, 105 is coupled to and/or includes respective transmit side logic 107, 109 for transmitting data (e.g., one or more portions of one or more data packets) from one processor 103, 105 and respective receive side logic 111, 113 for receiving data in the other processor 103, 105. Transmit side logic 109 of the second processor 105 may be coupled to receive side logic 111 of the first processor 103 by a bus 115 for transmitting data. In some embodiments, the bus 115 may be sixteen bytes wide for transmitting data packets with a granularity of eight bytes. Therefore, the bus 115 may transmit packets with total lengths that are any multiple of eight bytes (e.g., packets of varying lengths) from the second processor 105 to the first processor 103. One or more portions of such packets may be presented on the bus using varying widths (e.g., eight or sixteen bytes). Consequently, the bus 115 may transmit data in different ways, which are described below with reference to FIG. 2. For example, the bus 115 may be divided into multiple portions. A first portion may include the first eight bytes of the bus 115 and a second portion may include the second eight bytes of the bus 115. During operation, the first and second portions of the bus 115 may transmit one or more portions of the same packet or one or more portions of different packets, respectively.

The above-described width of the bus 115, widths employed to present packets and granularity of packets transmitted on the bus 115 are exemplary. For example, a larger or smaller bus width, width employed to present packets and/or packet granularity may be employed. In some embodiments, the bus 115 may be divided into a larger number of portions. Further, although only a single bus is shown, the apparatus 101 for checking data for errors may include a larger number of buses for transmitting data packets (e.g., packets that may be presented on the bus in varying widths (variable-width data packets)). For example, the apparatus may include a second bus 125, which is similar to bus 115, coupling the transmit side logic 107 of the first processor 103 to the receive side logic 113 of the second processor 105. A separate instantiation of the first control logic 117, transmit CRC logic 119, second control logic 121 and receive CRC logic 123 (shown in phantom) may be coupled to the second bus 125.

The apparatus 101 for checking data for errors includes first control logic 117 coupled to transmit CRC logic 119 both of which are coupled to the bus 115. The first control logic 117 is adapted to determine how a data packet is being transmitted on the bus 115 (e.g., by the transmit side logic 109), and based on how the data is being transmitted, provide control signals to the transmit CRC logic 119. The transmit CRC logic 119 is adapted to perform CRC on one or more portions of one or more such variable-width data packets. For example, the transmit CRC logic 119 may compute a pre-transfer CRC value of a variable-width data packet, insert the value into the variable-width data packet based on the control signals and transmit the variable-width data packet on the bus 115 to the first processor 103.

Similarly, the apparatus 101 for checking data for errors includes second control logic 121 coupled to receive CRC logic 123 both of which are coupled to the bus 115, and therefore, coupled to the receive side logic 111 of the first processor 103. The second control logic 121 is adapted to determine a how a data packet is being transmitted on the bus 115 (e.g., by the transmit CRC logic 119), and based on how the data is transmitted, provide control signals to the receive CRC logic 123. The receive CRC logic 123 is adapted to perform CRC on one or more portions of one or more variable-width data packets. More specifically, based on the control signals, the receive CRC logic 123 may remove and store a transmitted pre-transfer (e.g., received) CRC value inserted into a received variable-width packet (e.g., by transmit CRC logic 119), compute a post-transfer CRC value from such variable-width data packet and compare the post-transfer CRC value with the pre-transfer (e.g., received) CRC value. If results of the CRC computed by the transmit CRC logic 119 matches the result of the CRC computed by the receive CRC logic 123, the variable-width data packet was successfully transmitted without error. However, if the CRC results do not match, an error may have occurred during data transmission.

Details of the receive CRC logic 123 coupled to the first processor 103 are described below with reference to FIG. 3. The transmit CRC logic 119 may be similar to the receive CRC logic 123. However, as described above, the transmit CRC logic 119 computes and inserts a pre-transfer CRC value into a data packet and the receive CRC logic removes the pre-transfer (e.g., received) value from the data packet and computes a post-transfer CRC value.

FIG. 2 illustrates different ways in which one or more data packets are transmitted on a bus of the apparatus and corresponding values upon which control signals output by control logic of the apparatus are based in accordance with an embodiment of the present invention. With reference to FIG. 2, table 201 illustrates different scenarios of data transmission on the bus 115 and corresponding values upon which control signals input by the receive CRC logic 119 are based. More specifically, the first column 203 (e.g., "1st 8 Bytes") of table 201 includes information about which portion of a variable-width data packet is transmitted on the first portion (e.g., first eight) bytes of the bus 115. The second column 205 (e.g., "crc_in") includes information about whether the CRC performed on the one or more portions of the variable-width data packet transmitted by the first portion of the bus 115 is based on an intermediate CRC value (e.g., a result of a CRC performed on a portion of the packet previously transmitted on the bus 115). The third column 207 (e.g., "data (48:63)") includes information whether the last two bytes of data transmitted on the first portion of the bus 115 are relevant to the CRC. More specifically, the third column 207 indicates, if the data transmitted on the first portion of the bus is not an end of packet, the last two bytes of data transmitted on the first portion of the bus represents data in the packet. However, if the data transmitted on the first portion of the bus is an end of packet, on the transmit side, zeroes are inserted into the last two bytes of data transmitted on the first portion of the bus before performing CRC on the transmit side, and on the receive side, zeroes are inserted to replace data in the last two bytes of data transmitted on the first portion of the bus before performing CRC on the transmit side. The fourth column 209 (e.g., "2nd 8 Bytes") of table 201 includes information about which portion of a variable-width data packet is transmitted on the second portion (e.g., last eight bytes) of the bus 115. The fifth column 211 (e.g., "crc_in") includes information about whether the CRC performed on the one or more portions of the variable-width data packet transmitted by the second portion of the bus 115 is based on an intermediate CRC value. The sixth column 213 (e.g., "data (48:63)") includes information whether the last two bytes of data transmitted on the second portion of the bus 115 are relevant to the CRC. More specifically, similar to the third column 207, the sixth column 213 indicates, if the data transmitted on the second portion of the bus is not an end of packet, the last two bytes of data transmitted on the second portion of the bus represents data in the packet. However, if the data transmitted on the second portion of the bus is an end of packet, on the transmit side, zeroes are inserted into the last two bytes of data transmitted on the second portion of the bus before performing CRC on the transmit side, and on the receive side, zeroes are inserted to replace data in the last two bytes of data transmitted on the second portion of the bus before performing CRC on the transmit side.

In this manner, rows 215, 217, 219, 221, 223, 225, 227 of table 201 illustrate seven different ways in which data packets are transmitted on the bus 115 and corresponding values upon which control signals output by the second control logic 121 to the receive CRC logic 123 are based. Details of each row 215, 217, 219, 221, 223, 225, 227 of the table 201 are described below with reference to FIG. 3. Although table 201 illustrates seven different ways in which data packets are transmitted on the bus 115, a data packet may be transmitted on the bus 115 in a different way.

Figure 3:
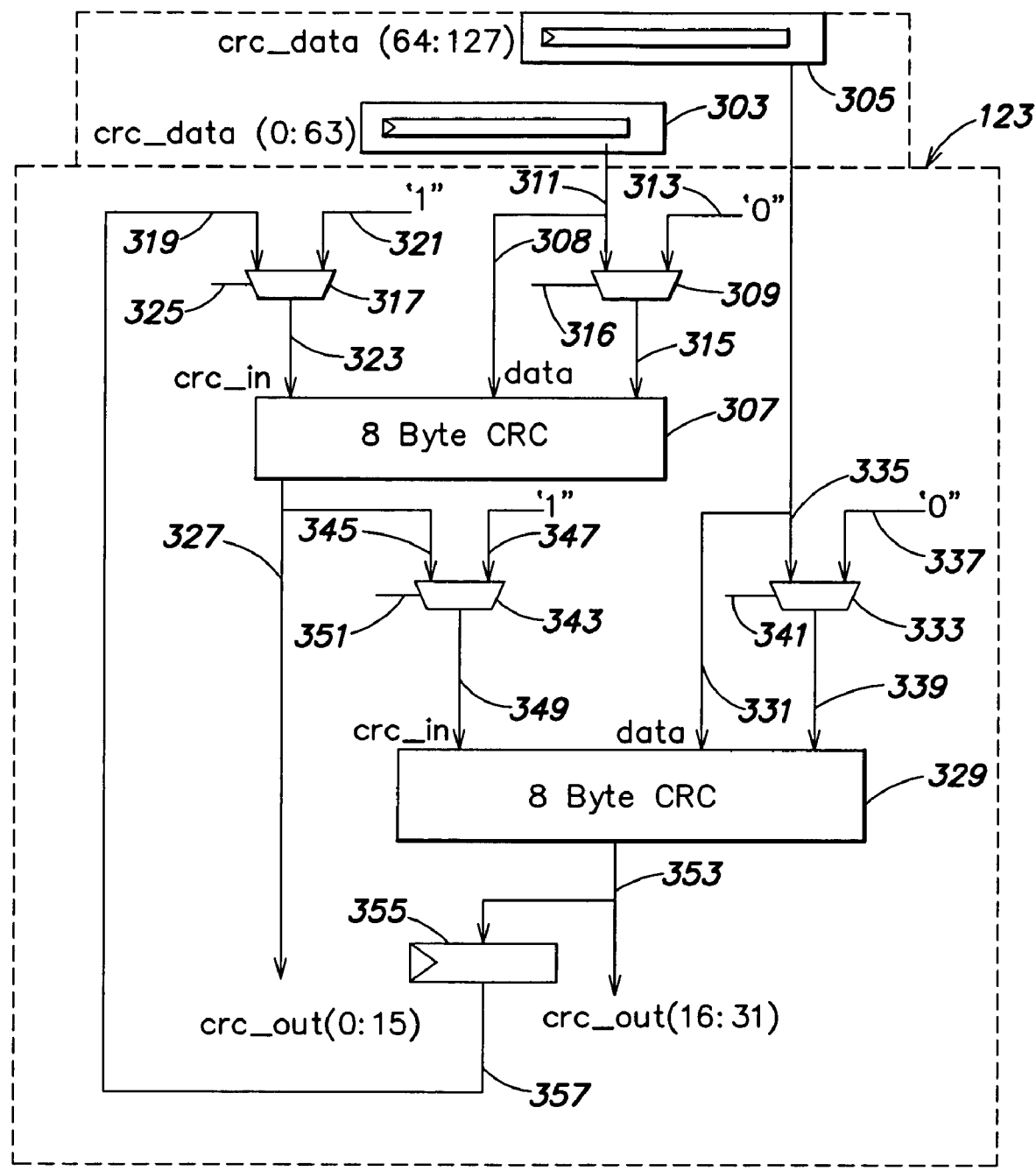
FIG. 3 is a block diagram of exemplary CRC logic included in the apparatus for checking data for errors in accordance with an embodiment of the present invention.

FIG. 3 is a block diagram of exemplary CRC logic included in the apparatus for checking data for errors in accordance with an embodiment of the present invention. With reference to FIG. 3, receive CRC logic 123 may couple to and receive input from a first register 303 for storing data transmitted on the first portion of the bus 115 and a second register 305 for storing data transmitted on the second portion of the bus 115. The first 303 and second registers 305 may be included in the second control logic 121 (although the first 303 and second registers 305 may be located elsewhere).

More specifically, the receive CRC logic 123 includes first CRC logic 307 for performing CRC on data transmitted on the first portion of the bus 115. An input 308 of the first CRC logic 307 is coupled to the first register 303 and receives data, which represents portions of data (e.g., the first six bytes) transmitted on the first portion of the bus 115, output by the first register 303 as input. The receive CRC logic 123 includes a first multiplexer 309, a first input 311 of which is coupled to the first register 303, a second input 313 of which is coupled to a low logic state (e.g., a logic "0") and an output 315 of which is input by the first CRC logic 307. In this manner, the first multiplexer 309 may input data representing the last two bytes of data transmitted on the first portion of the bus 115 via the first input 311 and two bytes of logic "0"s via the second input 313. The first multiplexer 309 includes a third input (e.g., a "control" input) 316, which may be coupled to the second control logic (not shown in FIG. 3; 121 in FIG. 1), for receiving a signal (e.g., select signal) indicating whether an end of packet is transmitted on the first portion of the bus 115. Based on the signal input by the first multiplexer 309 via the third input (e.g., "control" input) 316, the first multiplexer 309 selectively outputs the last two bytes of data transmitted on the first portion of the bus or two bytes of logic "0"s, which serve as the last two bytes of data transmitted on the first portion of the bus 115.

The receive CRC logic 123 includes a second multiplexer 317, a first input 319 of which may be coupled to a result of a CRC performed on a portion of the packet previously transmitted on the bus 115 (e.g., intermediate or partial CRC), a second input 321 of which is coupled to a high logic state (e.g., a logic "1") and an output 323 of which is input by the first CRC logic 307. In this manner, the second multiplexer 317 inputs data representing the partial CRC via the first input 319 and two bytes of logic "1"s via the second input 321, which serves as an initial CRC for the first CRC logic 307. The second multiplexer 317 includes a third input (e.g., a "control" input) 325, which may be coupled to the second control logic (not shown in FIG. 3; 121 in FIG. 1), for receiving a signal (e.g., select signal) indicating whether a start of a packet is transmitted on the first portion of the bus 115. Based on the signal input by the second multiplexer 317 via the third input (e.g., "control" input) 325, the second multiplexer 317 selectively outputs the partial CRC or two bytes of logic "1"s. Based on the inputs described above, the first CRC logic 307 is adapted to perform CRC on the data transmitted on the first portion of the bus 115 and provide a result of such CRC (e.g., a two-byte result) via a first CRC logic output 327.

Similarly, the receive CRC logic 123 includes second CRC logic 329 for performing CRC on data transmitted on the second portion of the bus 115. An input 331 of the second CRC logic 329 is coupled to the second register 305 and receives data, which represents portions of data (e.g., the first six bytes) transmitted on the second portion of the bus 115, output by the second register 305 as input. The receive CRC logic 123 includes a third multiplexer 333, a first input of which 335 is coupled to the second register 305, a second input 337 of which is coupled to a low logic state (e.g., a logic "0") and an output 339 of which is input by the second CRC logic 329. In this manner, the third multiplexer 333 may input data representing the last two bytes of data transmitted on the second portion of the bus 115 via the first input 335 and two bytes of logic "0"s via the second input 337. The third multiplexer 333 includes a third input (e.g., a "control" input) 341, which may be coupled to the second control logic (not shown in FIG. 3; 121 in FIG. 1), for receiving a signal (e.g., select signal) indicating whether an end of packet is transmitted on the second portion of the bus 115. Based on the signal input by the third multiplexer 333 via the third input (e.g., a "control" input) 341, the third multiplexer 333 selectively outputs the last two bytes of data transmitted on the second portion of the bus 115 or two bytes of logic "0"s, which serve as the last two bytes of data transmitted on the second portion of the bus 115.

The receive CRC logic 123 includes a fourth multiplexer 343, a first input 345 of which may be coupled to a result of a CRC (e.g., intermediate CRC) performed on a portion of the packet previously transmitted (e.g., transmitted on the first portion of the bus 115) on the bus 115, a second input 347 of which is coupled to a high logic state (e.g., a logic "1") and an output 349 of which is input by the second CRC logic 329. In this manner, the fourth multiplexer 343 inputs data representing the partial CRC via the first input 345 and two bytes of logic "1"s via the second input 347, which serves as an initial CRC for the second CRC logic 329. The fourth multiplexer 343 includes a third input (e.g., a "control" input) 351, which may be coupled to the second control logic (not shown in FIG. 3; 121 in FIG. 1), for receiving a signal (e.g., select signal) indicating whether a start of a packet is transmitted on the second portion of the bus 115. Based on the signal input by the fourth multiplexer 343 via the third input (e.g., "control" input) 351, the second multiplexer 343 selectively outputs the partial CRC or two bytes of logic "1"s. Based on the inputs described above, the second CRC logic 329 is adapted to perform CRC on the data transmitted on the second portion of the bus 115 and provide a result of such CRC (e.g., a two-byte result) via a second CRC logic output 353.

The output 353 of the second CRC logic 329 is coupled to the first input 319 of the second multiplexer 319. More specifically, the output 353 of the second CRC logic 329 may be coupled to a register 355 for storing the CRC result of the second CRC logic 329. The output 357 of the register 355 is coupled to the first input 319 of the second CRC logic 329. Consequently, the second CRC logic 329 may provide a CRC result (e.g., an intermediate CRC result) to the second multiplexer 317.

In this manner, the first CRC logic 307 and/or second CRC logic 329 may provide an intermediate CRC result or a CRC result (e.g., a final CRC result). For example, the output of the first CRC logic 307 and second CRC logic 329 may be final CRC results. Alternatively, the output of the first CRC logic 307 may be an intermediate CRC result that is provided to the second CRC logic 329, the output of which is a final CRC result. In another case, the output of the first CRC logic 307 may be a final CRC result and the output of the second CRC logic 329 may be an intermediate CRC result that is provided (e.g., as feedback) to the first CRC logic 307. Other scenarios are possible. The configuration of the receive CRC logic 123 is exemplary. Therefore, in some embodiments, the receive CRC logic may be configured differently.

The operation of the apparatus 101 for checking data for errors is now described with reference to FIGS. 1-3 for each of the seven different ways in which one or more data packets are transmitted on the bus 115. With reference to FIGS. 1-3, the second control logic 121 is adapted to observe data (e.g., one or more portions of one or more packets) transmitted on the bus 115 and determine the way in which such data is transmitted. For example, second control logic 121 may determine (1) a first eight byte packet is transmitted on a first portion (e.g., a first eight bytes) of the bus 115 and a second eight byte packet is transmitted on a second portion (e.g., a second eight bytes) of the bus 115; (2) a first eight byte packet is transmitted on the first portion of the bus 115 and the beginning or start (e.g., the first eight bytes) of a second packet that is larger than eight bytes is transmitted on the second portion of the bus 115; (3) the end (e.g., last eight bytes) of a first packet that is larger than eight bytes is transmitted on the first portion of the bus 115 and an eight byte packet is transmitted on the second portion of the bus 115; (4) an end (e.g., last eight bytes) of a first packet that is greater than eight bytes is transmitted on the first portion of the bus 115 and a beginning (e.g., first eight bytes) of a second packet that is greater than eight bytes is transmitted on the second portion of the bus 115; (5) the start (e.g., first sixteen bytes) of a packet that is greater than sixteen bytes is transmitted on the bus 115; (6) a center portion (e.g., a portion other than the first or last eight bytes) of a packet that is greater than sixteen bytes is transmitted on the bus 115; or (7) an end (e.g., the last sixteen bytes) of packet that is greater than sixteen bytes is transmitted on the bus. In this manner, one or more portions of a data packet may be presented on the bus 115 using varying widths (e.g., eight or sixteen bytes of the packet may be presented on the bus at one time). The second control logic 121 may determine whether one or more portions of a plurality of packets are transmitted on the bus 115 by determining whether a flag (e.g., bit) indicating, for example, an end of packet is set in one or more portions of the one or more packets transmitted on the bus 115.

As stated, the receive CRC logic 123 may remove and store a CRC value inserted (e.g., by transmit CRC logic 119) into a received variable-width packet before performing CRC on such packet.

If a portion of the bus 115 is transmitting a start of a packet, an initial CRC value of logic "1"s may be input by the CRC logic 307, 329 corresponding to that portion. However, if a portion of the bus 115 is not transmitting the start of a packet, a partial or intermediate CRC value representing a CRC performed on a portion of the packet previously transmitted on the bus 115 is input by the CRC logic 307, 329. If a portion of the bus 115 is transmitting an end of a packet, logic "0"s may be input by the CRC logic 307, 329 corresponding to that portion to represent the last two bytes of data transmitted by that portion of the bus 115. In this manner, the CRC value (e.g., pre-transfer CRC value) computed by the transmit CRC logic 119 may be removed from the packet before the receive CRC logic 123 computes an post-transfer CRC value for the packet. However, if a portion of the bus 115 is not transmitting an end of a packet, the CRC logic 307, 329 corresponding to that portion inputs the last two bytes of the data.

As illustrated by the first row 215 of the table 201, the second control logic 121 may determine a first eight byte packet is transmitted on a first portion (e.g., a first eight bytes) of the bus 115 and a second eight byte packet is transmitted on a second portion (e.g., a second eight bytes) of the bus 115. Because the data transmitted on the first portion of the bus 115 represents both the end and start of a data packet (e.g., a complete packet), the second control logic 121 provides a control signal to the second multiplexer 317 such that the second multiplexer 317 outputs logic "1"s as an initial CRC value for the first CRC logic 307 and provides a control signal to the first multiplexer 309 such that the first multiplexer 309 outputs logic "0"s. Based on such inputs by the first CRC logic 307, the first CRC logic 307 outputs a CRC result for the data packet transmitted on the first portion of the bus 115.

Similarly, because the data transmitted on the second portion of the bus 115 represents both the end and start of a data packet (e.g., a complete packet), the second control logic 121 provides a control signal to the fourth multiplexer 343 such that the fourth multiplexer 343 outputs logic "1"s as an initial CRC value for the second CRC logic 329 and provides a control signal to the third multiplexer 333 such that the third multiplexer 333 inputs logic "0"s. Based on such inputs by the second CRC logic 329, the second CRC logic 329 outputs a CRC result for the data packet transmitted on the second portion of the bus 115. Because the CRC performed by the first 307 and second CRC logic 329 do not depend on each other, the receive CRC logic 123 may perform CRC on data transmitted on the first and second portions of the bus 115 in parallel.

As illustrated by the second row 217 of the table 201, the second control logic 121 may determine a first eight byte packet is transmitted on the first portion of the bus 115 and the start (e.g., the first eight bytes) of a second packet that is larger than eight bytes is transmitted on the second portion of the bus 115. Because the data transmitted on the first portion of the bus 115 represents both the end and start of a data packet (e.g., a complete packet), the second control logic 121 provides a control signal to the second multiplexer 317 such that the second multiplexer 317 outputs logic "1"s as an initial CRC value for the first CRC logic 307 and provides a control signal to the first multiplexer 309 such that the first multiplexer 309 outputs logic "0"s. Based on such inputs by the first CRC logic 307, the first CRC logic 307 outputs a CRC result for the data packet transmitted on the first portion of the bus 115.

However, because the data transmitted on the second portion of the bus 115 represents the start but not the end of the second packet, the second control logic 121 provides a control signal to the fourth multiplexer 343 such that the fourth multiplexer 343 outputs logic "1"s as an initial CRC value for the second CRC logic 329 and provides a control signal to the third multiplexer 333 such that the third multiplexer 333 outputs the last two bytes of the data transmitted on the second portion of the bus 115. Based on such inputs by the second CRC logic 329, the second CRC logic 329 outputs a CRC result (e.g., a partial CRC result) for the portion of the data packet transmitted on the second portion of the bus 115. Because the CRC performed by the first 307 and second CRC logic 329 do not depend on each other, the receive CRC logic 123 may perform CRC on data transmitted on the first portion and a partial CRC on data transmitted on the second portion of the bus 115 in parallel.

As illustrated by the third row 217 of the table 201, the second control logic 121 may determine an end (e.g., last eight bytes) of a first packet that is larger than eight bytes is transmitted on the first portion of the bus 115 and an eight byte packet is transmitted on the second portion of the bus 115. Because data transmitted on the first portion of the bus 115 represents the end but not the beginning of the first packet, the second control logic 121 provides a control signal to the second multiplexer 317 such that the second multiplexer 317 outputs a partial CRC result provided by the second CRC logic output 353 as an initial CRC value for the first CRC logic 309 and provides a control signal to the first multiplexer 309 such that the first multiplexer 309 outputs logic "0"s. Based on such inputs by the first CRC logic 307, the first CRC logic 307 outputs a CRC result for the data packet transmitted on the first portion of the bus 115.

However, because the data transmitted on the second portion of the bus 115 represents both the end and start of a data packet (e.g., a complete packet), the second control logic 121 provides a control signal to the fourth multiplexer 343 such that the fourth multiplexer 343 outputs logic "1"s as an initial CRC value for the second CRC logic 329 and provides a control signal to the third multiplexer 333 such that the third multiplexer 333 outputs logic "0"s. Based on such inputs by the second CRC logic 329, the second CRC logic 329 outputs a CRC result for the data packet transmitted on the second portion of the bus 115. Because the CRC performed by the first 307 and second CRC logic 329 do not depend on each other, the receive CRC logic 123 may perform CRC on data transmitted on the first and second portions of the bus 115 in parallel.

As illustrated by the fourth row 221 of the table 201, the second control logic 121 may determine an end (e.g., last eight bytes) of a first packet that is greater than eight bytes is transmitted on the first portion of the bus 115 and a start (e.g., first eight bytes) of a second packet that is greater than eight bytes is transmitted on the second portion of the bus 115. Because the data transmitted on the first portion of the bus 115 represents the end but not the beginning of the first packet, the second control logic 121 provides a control signal to the second multiplexer 317 such that the second multiplexer 317 outputs a partial CRC provided by the second CRC logic output 353 as an initial CRC value for the first CRC logic 307 and provides a control signal to the first multiplexer 309 such that the first multiplexer 309 outputs logic "0"s. Based on such inputs by the first CRC logic 307, the first CRC logic 307 outputs a CRC result for the data packet transmitted on the first portion of the bus 115.

However, because the data transmitted on the second portion of the bus 115 represents the beginning but not the end of the second packet, the second control logic 121 provides a control signal to the fourth multiplexer 343 such that the fourth multiplexer 343 outputs logic "1"s as an initial CRC value for the second CRC logic 329 and provides a control signal to the third multiplexer 333 such that the third multiplexer 333 outputs the last two bytes of data transmitted on the second portion of the bus 115. Based on such inputs by the second CRC logic 329, the second CRC logic 329 outputs a CRC result (e.g., a partial CRC result) for the portion of the second data packet transmitted on the second portion of the bus 115. Because the CRC performed by the first 307 and second CRC logic 329 do not depend on each other, the receive CRC logic 123 may perform CRC on data transmitted on the first and second portions of the bus 115 in parallel.

As illustrated by the fifth row 223 of the table 201, the second control logic 121 may determine the start (e.g., first sixteen bytes) of a packet that is greater than sixteen bytes is transmitted on the bus 115. Because the data transmitted on the first portion of the bus 115 represents the start but not the end of the packet, the second control logic 121 provides a control signal to the second multiplexer 317 such that the second multiplexer 317 outputs logic "1"s as an initial CRC value for the first CRC logic 307 and provides a control signal to the first multiplexer 309 such that the first multiplexer 309 outputs the last two bytes of the data transmitted on the first portion of the bus 115. Based on such inputs by the first CRC logic 307, the first CRC logic 307 outputs a CRC result (e.g., partial CRC result) for the portion of the data packet transmitted on the first portion of the bus 115, which as stated above, is provided on the first input 345 of the fourth multiplexer 343.

However, because the data transmitted on the second portion of the bus 115 represents neither the start nor the end of the packet, the second control logic 121 provides a control signal to the fourth multiplexer 343 such that the fourth multiplexer 343 outputs the partial CRC provided by the first CRC logic output 327 and provides a control signal to the third multiplexer 333 such that the third multiplexer 309 outputs the last two bytes of data transmitted on the second portion of the bus 115. Based on such inputs by the second CRC logic 329, the second CRC 329 outputs a CRC result (e.g., a partial CRC result) for the portion of the packet transmitted on the bus 115. Because the second CRC logic 329 may not perform CRC without the result (e.g., partial CRC result) of the CRC performed by the first CRC logic 307, the first 307 and second CRC logic 329 perform CRC in cascade in the manner described above.

As illustrated by the sixth row 225 of the table 201, the second control logic 121 may determine a center portion (e.g., a portion other than the first or last eight bytes) of a packet that is greater than sixteen bytes is transmitted on the bus 115. Because the data transmitted on the first portion of the bus 115 represents neither the start nor the end of the packet, the second control logic 121 provides a control signal to the second multiplexer 317 such that the second multiplexer 317 outputs a partial CRC result provided by the second CRC logic output 353 and provides a control signal to the first multiplexer 309 such that the first multiplexer 309 outputs the last two bytes of data transmitted on the first portion of the bus 115. Based on such inputs by the first CRC logic 307, the first CRC logic 307 outputs a CRC result (e.g., a partial CRC result) for the portion of the data packet transmitted on the first portion of the bus 115, which as stated above, is provided on the first input 345 of the fourth multiplexer 343.

Similarly, because the data transmitted on the second portion of the bus 115 represents neither the start nor the end of the packet, the second control logic 121 provides a control signal to the fourth multiplexer 343 such that the fourth multiplexer 343 outputs the partial CRC provided by the first CRC logic output 349 and provides a control signal to the third multiplexer 333 such that the third multiplexer 333 outputs the last two bytes of data transmitted on the second portion of the bus 115. Based on such inputs by the second CRC logic 329, the second CRC logic 329 outputs a CRC result (e.g., a partial CRC result) for the portion of the packet transmitted on the bus 115. Because the second CRC logic 329 may not perform CRC without the result (e.g., partial CRC result) of the CRC performed by the first CRC logic 307, the first 307 and second CRC logic 329 perform CRC in cascade in the manner described above.

As illustrated by the seventh row 225 of the table 201, the second control logic 121 may determine an end (e.g., the last sixteen bytes) of a packet that is greater than sixteen bytes is transmitted on the bus 115. Because the data transmitted on the first portion of the bus 115 represents neither the start nor the end of the packet, the second control logic 121 provides a control signal to the second multiplexer 317 such that the second multiplexer 317 outputs a partial CRC result provided by the second CRC logic output 353 and provides a control signal to the first multiplexer 309 such that the first multiplexer 309 outputs the last two bytes of data transmitted on the first portion of the bus 115. Based on such inputs by the first CRC logic 307, the first CRC logic 307 outputs a CRC result (e.g., a partial CRC result) for the portion of the data packet transmitted on the first portion of the bus 115, which as stated above, is provided on the first input 345 of the fourth multiplexer 343.

However, because the data transmitted on the second portion of the bus 115 represents the end but not the start of the packet, the second control logic 121 provides a control signal to the fourth multiplexer 343 such that the fourth multiplexer 343 outputs the partial CRC provided by the first CRC logic output 349 and provides a control signal to the third multiplexer 333 such that the third multiplexer 333 outputs logic "0"s. Based on such inputs by the second CRC logic 329, the second CRC logic 329 outputs a CRC result for the data packet transmitted on the bus 115. Because the second CRC logic 329 may not perform CRC without the result (e.g., partial CRC result) of the partial CRC performed by the first CRC logic 307, the first 307 and second CRC logic 329 perform CRC in cascade in the manner described above.

Through use of the present methods and apparatus, CRC may be performed on packets that may be presented on the bus using varying widths (e.g., variable-width packets) using a single logic circuit 123, thereby eliminating the need for a separate logic circuit for performing CRC on packets of each possible packet width. The logic (e.g., receive CRC logic 123) is adapted to dynamically reconfigure itself to perform CRC on a data packet transmitted on the bus in one or more of the different ways described above. Therefore, the present methods and apparatus provide dynamic reconfigurability of CRC control based on the data packet.

The foregoing description discloses only exemplary embodiments of the invention. Modifications of the above disclosed apparatus and methods which fall within the scope of the invention will be readily apparent to those of ordinary skill in the art. For instance, although the receive CRC logic 123 is described, the structure and operation of the transmit CRC logic 119 may be similar. Some or all of the logic described above, such as transmit side logic 107, 109, receive side logic 111, 113, first control logic 117, transmit CRC logic 119, second control logic 121, receive CRC logic 123, first CRC logic 307 and second CRC logic 329 may include any suitable combination of logic, registers, memory or the like, and in at least one embodiment, may comprise or be part of application specific integrated circuit (ASIC). Further, in some embodiments, the second control logic 121 may determine the start and end of a packet (e.g., a sixteen byte packet), which is as wide as the bus, is transmitted on the bus 115. In such embodiments, a CRC may be performed on one or more portions of the packet transmitted on the first portion of the bus 115 to obtain a first partial CRC result, and a CRC may be performed on one or more portions of the packet transmitted on the second portion of the bus based on the first partial CRC result to obtain a CRC result for the packet.

In a broader aspect, the present invention provides methods of and apparatus for (1) transmitting data on a bus, wherein data is presented on the bus using varying widths; (2) configuring a cyclic redundancy check (CRC) to be performed on the data based on the manner in which data is presented on the bus; and (3) performing the CRC on the data. The CRC may be performed on the data in parallel or cascade.

Accordingly, while the present invention has been disclosed in connection with exemplary embodiments thereof, it should be understood that other embodiments may fall within the spirit and scope of the invention, as defined by the following claims.

The invention claimed is:

1. A method of checking data for errors, comprising:
   transmitting one or more portions of one or more packets on a bus, wherein a length of each of the one or more packets are a multiple of a predetermined size and the bus width is a multiple greater than 1 of the predetermined size;
   determining whether the bus is transmitting one or more portions of a plurality of packets;
   if the bus is transmitting one or more portions of a plurality of packets, performing a cyclic redundancy check (CRC) on the one or more portions of each of the plurality of packets in parallel; and
   if the bus is not transmitting one or more portions of a plurality of packets:
      performing a CRC on the one or more portions of the packet transmitted on a first portion of the bus; and
      performing a CRC on the one or more portions of the packet transmitted on a second portion of the bus based on a result of the CRC performed on the one or more portions of the packet transmitted on the first portion of the bus.

2. The method of claim 1 wherein determining whether the bus is transmitting one or more portions of a plurality of packets includes determining whether a bit indicating an end of packet is set in one or more portions of the one or more packets transmitted on the bus.

3. The method of claim 1 wherein performing a CRC on the one or more portions of each of the plurality of packets in parallel includes:
   performing a CRC on an entire first packet transmitted on a first portion of the bus; and
   performing a CRC on an entire second packet transmitted on a second portion of the bus.

4. The method of claim 1 wherein performing a CRC on the one or more portions of each of the plurality of packets in parallel includes:
   performing a CRC on an entire first packet transmitted on a first portion of the bus;
   performing a CRC on a portion of a second packet transmitted on a second portion of the bus to yield a partial CRC result; and
   providing the partial CRC result for a CRC performed on a remaining portion of the second packet.

5. The method of claim 1 wherein performing a CRC on the one or more portions of each of the plurality of packets in parallel includes:
   receiving a partial CRC result from a CRC previously performed on a first portion of a first packet transmitted on the bus;
   performing a CRC on a remaining portion of the first packet transmitted on a first portion of the bus based on the partial CRC result to yield a CRC result for the first packet; and
   performing a CRC on an entire second packet transmitted on a second portion of the bus.

6. The method of claim 1 wherein performing a CRC on the one or more portions of each of the plurality of packets in parallel includes:
   receiving a partial CRC result from a CRC previously performed on a first portion of a first packet transmitted on the bus;

performing a CRC on a remaining portion of the first packet transmitted on a first portion of the bus based on the partial CRC result to yield a CRC result for the first packet;
performing a CRC on a portion of a second packet transmitted on a second portion of the bus to obtain a partial CRC result; and
providing the partial CRC result from the CRC performed on the portion of the second packet for a CRC performed on a remaining portion of the second packet.

7. The method of claim 1 wherein if the bus is not transmitting one or more portions of a plurality of packets:
performing a CRC on the one or more portions of the packet transmitted on the first portion of the bus includes performing a CRC on a starting portion of the packet to obtain a first partial CRC result; and
performing a CRC on the one or more portions of the packet transmitted on a second portion of the bus based on the result of the CRC performed on the one or more portions of the packet transmitted on the first portion of the bus includes performing a CRC on the one or more portions of the packet transmitted on the second portion of the bus based on the first partial CRC result to obtain a second partial CRC result; and
further comprising providing the second partial CRC result for a CRC performed on a remaining portion of the packet.

8. The method of claim 1 further comprising receiving a result of a CRC performed on one or more portions of a packet previously transmitted on the bus; and
wherein, if the bus is not transmitting one or more portions of a plurality of packets:
performing a CRC on the one or more portions of the packet transmitted on a first portion of the bus includes performing a CRC on the one or more portions of the packet transmitted on the first portion of the bus, based on the result of the CRC performed on the one or more portions of the packet previously transmitted on the bus, to obtain a first partial CRC result; and
performing a CRC on the one or more portions of the packet transmitted on a second portion of the bus based on the result of the CRC performed on the one or more portions of the packet transmitted on the first portion of the bus includes performing a CRC on the one or more portions of the packet transmitted on the second portion of the bus based on the first partial CRC result to obtain a second partial CRC result.

9. The method of claim 8 further comprising providing the second partial CRC result for a CRC performed on a remaining portion of the packet.

10. The method of claim 1 further comprising receiving a result of a CRC performed on one or more portions of a packet previously transmitted on the bus; and
wherein, if the bus is not transmitting one or more portions of a plurality of packets:
performing a CRC on the one or more portions of the packet transmitted on a first portion of the bus includes performing a CRC on one or more portions of the packet transmitted on the first portion of the bus, based on the result of the CRC performed on one or more portions of the packet previously transmitted on the bus, to obtain a first partial CRC result; and
performing a CRC on the one or more portions of the packet transmitted on a second portion of the bus based on the result of the CRC performed on the one or more portions of the packet transmitted on the first portion of the bus includes performing a CRC on the one or more portions of an end of the packet transmitted on the second portion of the bus, based on the first partial CRC result, to obtain a result of the CRC on the packet.

11. An apparatus for checking data for errors, comprising:
a bus for transmitting data packets, wherein the bus width is a multiple greater than 1 of a predetermined size;
CRC logic, coupled to the bus, for performing CRC on data packets received from the bus; and
control logic, coupled to the bus and CRC logic, for providing control signals to the CRC logic;
wherein the apparatus is adapted to:
transmit one or more portions of one or more packets on the bus, wherein a length of each of the one or more packets are a multiple of the predetermined size;
determine whether the bus is transmitting one or more portions of a plurality of packets;
if the bus is transmitting one or more portions of a plurality of packets, perform a cyclic redundancy check (CRC) on the one or more portions of each of the plurality of packets in parallel; and
if the bus is not transmitting one or more portions of a plurality of packets:
perform a CRC on the one or more portions of the packet transmitted on a first portion of the bus; and
perform a CRC on the one or more portions of the packet transmitted on a second portion of the bus based on a result of the CRC performed on the one or more portions of the packet transmitted on the first portion of the bus.

12. The apparatus of claim 11 wherein the apparatus is further adapted to determine whether a bit indicating an end of packet is set in one or more portions of the one or more packets transmitted on the bus.

13. The apparatus of claim 11 wherein the apparatus is further adapted to:
perform a CRC on an entire first packet transmitted on a first portion of the bus; and
perform a CRC on an entire second packet transmitted on a second portion of the bus.

14. The apparatus of claim 11 wherein the apparatus is further adapted to:
perform a CRC on an entire first packet transmitted on a first portion of the bus;
perform a CRC on a portion of a second packet transmitted on a second portion of the bus to yield a partial CRC result; and
provide the partial CRC result for a CRC performed on a remaining portion of the second packet.

15. The apparatus of claim 11 wherein the apparatus is further adapted to:
receive a partial CRC result from a CRC previously performed on a first portion of a first packet transmitted on the bus;
perform a CRC on a remaining portion of the first packet transmitted on a first portion of the bus based on the partial CRC result to yield a CRC result for the first packet; and
perform a CRC on an entire second packet transmitted on a second portion of the bus.

16. The apparatus of claim 11 wherein the apparatus is further adapted to:
- receive a partial CRC result from a CRC previously performed on a first portion of a first packet transmitted on the bus;
- perform a CRC on a remaining portion of the first packet transmitted on a first portion of the bus based on the partial CRC result to yield a CRC result for the first packet;
- perform a CRC on a portion of a second packet transmitted on a second portion of the bus to obtain a partial CRC result; and
- provide the partial CRC result from the CRC performed on the portion of the second packet for a CRC performed on a remaining portion of the second packet.

17. The apparatus of claim 11 wherein the apparatus is further adapted to:
- if the bus is not transmitting one or more portions of a plurality of packets:
  - perform a CRC on a starting portion of the packet to obtain a first partial CRC result; and
  - perform a CRC on the one or more portions of the packet transmitted on the second portion of the bus based on the first partial CRC result to obtain a second partial CRC result; and
  - provide the second partial CRC result for a CRC performed on a remaining portion of the packet.

18. The apparatus of claim 11 wherein the apparatus is further adapted to:
- receive a result of a CRC performed on one or more portions of a packet previously transmitted on the bus; and
- if the bus is not transmitting one or more portions of a plurality of packets:
  - perform a CRC on the one or more portions of the packet transmitted on the first portion of the bus, based on the result of the CRC performed on the one or more portions of the packet previously transmitted on the bus, to obtain a first partial CRC result; and
  - perform a CRC on the one or more portions of the packet transmitted on the second portion of the bus based on the first partial CRC result to obtain a second partial CRC result.

19. The apparatus of claim 18 wherein the apparatus is further adapted to provide the second partial CRC result for a CRC performed on a remaining portion of the packet.

20. The apparatus of claim 11 wherein the apparatus is further adapted to:
- receive a result of a CRC performed on one or more portions of a packet previously transmitted on the bus; and
- if the bus is not transmitting one or more portions of a plurality of packets:
  - perform a CRC on one or more portions of the packet transmitted on the first portion of the bus, based on the result of the CRC performed on one or more portions of the packet previously transmitted on the bus, to obtain a first partial CRC result; and
  - perform a CRC on the one or more portions of an end of the packet transmitted on the second portion of the bus, based on the first partial CRC result, to obtain a result of the CRC on the packet.

* * * * *